United States Patent
Chen et al.

(10) Patent No.: US 10,750,644 B2
(45) Date of Patent: Aug. 18, 2020

(54) REAR SIDE SWAPPABLE FAN ARRAY MODULE DESIGN

(71) Applicant: QUANTA COMPUTER INC., Taoyuan (TW)

(72) Inventors: Chao-Jung Chen, Taoyuan (TW); Chih-Wei Lin, Taoyuan (TW); Ming-Lun Ku, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 1 day.

(21) Appl. No.: 15/939,716

(22) Filed: Mar. 29, 2018

(65) Prior Publication Data

US 2019/0215990 A1    Jul. 11, 2019

Related U.S. Application Data

(60) Provisional application No. 62/613,869, filed on Jan. 5, 2018.

(51) Int. Cl.
| | |
|---|---|
| *H05K 7/20* | (2006.01) |
| *H05K 7/14* | (2006.01) |
| *F04D 25/06* | (2006.01) |
| *F04D 25/16* | (2006.01) |
| *G06F 1/20* | (2006.01) |

(52) U.S. Cl.
CPC ......... *H05K 7/20736* (2013.01); *F04D 25/06* (2013.01); *F04D 25/166* (2013.01); *G06F 1/20* (2013.01); *H05K 7/1489* (2013.01); *H05K 7/1492* (2013.01); *H05K 7/20172* (2013.01)

(58) Field of Classification Search
CPC ............. H05K 7/20736; H05K 7/1492; H05K 7/1489; F04D 25/166; F04D 25/06

USPC .................... 361/690, 679.48, 695, 725, 727
See application file for complete search history.

(56) References Cited

U.S. PATENT DOCUMENTS

| | | | |
|---|---|---|---|
| 6,752,587 B2 * | 6/2004 | Lin ....................... | F04D 25/166 415/220 |
| 7,054,155 B1 * | 5/2006 | Mease ................ | H05K 7/20581 165/104.34 |
| 7,445,430 B2 * | 11/2008 | Kao ........................ | G06F 1/181 415/121.2 |
| 7,771,165 B2 * | 8/2010 | Chen ..................... | F04D 29/601 174/252 |
| 8,246,301 B2 * | 8/2012 | Li ....................... | H05K 7/20172 415/213.1 |

(Continued)

FOREIGN PATENT DOCUMENTS

| | | |
|---|---|---|
| CN | 100502628 C | 6/2009 |
| JP | 2014515139 A | 6/2014 |
| TW | I548326 B | 9/2016 |

OTHER PUBLICATIONS

TW Office Action for Application No. 107120576, dated Apr. 30, 2019, w/ First Office Action Summary.

(Continued)

*Primary Examiner* — Mandeep S Buttar
(74) *Attorney, Agent, or Firm* — Nixon Peabody LLP

(57) ABSTRACT

A server device is provided with a fan module that includes a removable or reconfigurable partition for different size fan units based on system requirements. The chassis can include a plurality of sleds and a fan module. The fan module includes a removable partition that can be configured to house a plurality of fan units.

8 Claims, 7 Drawing Sheets

(56) References Cited

U.S. PATENT DOCUMENTS

| | | | |
|---|---|---|---|
| 8,773,861 B2 | 7/2014 | Ross et al. | |
| 8,939,722 B2* | 1/2015 | Liu | H05K 7/20172 415/213.1 |
| 9,055,690 B2 | 6/2015 | Ross et al. | |
| 9,491,889 B2 | 11/2016 | Li | |
| 2004/0130872 A1* | 7/2004 | Cravens | G06F 1/20 361/695 |
| 2006/0120040 A1* | 6/2006 | Chen | H05K 7/20172 361/695 |
| 2006/0120041 A1* | 6/2006 | Chen | G06F 1/20 361/695 |
| 2009/0009661 A1 | 1/2009 | Li | |
| 2012/0327599 A1* | 12/2012 | Dickinson | F04D 25/166 361/695 |
| 2013/0188309 A1* | 7/2013 | Ross | H05K 7/20727 361/679.48 |
| 2014/0139998 A1* | 5/2014 | Tasi | H05K 7/20736 361/679.48 |
| 2015/0070843 A1* | 3/2015 | Mao | H05K 7/20172 361/695 |
| 2015/0177750 A1* | 6/2015 | Bailey | H05K 7/20736 700/275 |
| 2016/0135322 A1* | 5/2016 | Chen | G11B 33/142 361/679.46 |
| 2017/0034953 A1 | 2/2017 | Chen et al. | |
| 2017/0082111 A1* | 3/2017 | Barron | F04D 27/004 |
| 2017/0097003 A1* | 4/2017 | Chen | F04D 19/002 |
| 2017/0188484 A1* | 6/2017 | Kwon | F04D 19/002 |

OTHER PUBLICATIONS

TW Search Report for Application No. 107120576, dated Apr. 30, 2019, w/ First Office Action.

Extended European Search Report for EP Application No. 18192560.3, dated Apr. 5, 2019.

JP Office Action for Application No. 2018-197146, dated Nov. 5, 2019, w/ First Office Action Summary.

JP Office Action for Application No. 2018-197146, dated May 19, 2020, w/ Second Office Action Summary.

HSP Series; HSP-44, HSP-88, HSP-133; Apr. 18, 2011, 4 pages, http://www.marutsu.co.jp/contents/shop/marutsu/datasheet/HSP.11-11.pdf; JP.

HSP-44PA, HSP-88PA, HSP-133PA; Feb. 10, 2014, 6 pages, https://web.archive.org/web/20150210144524/https://adwecs.jp/categories/ichiran.asp?MCate=1321; ADWECS Co. Ltd., JP.

* cited by examiner

REAR SIDE SWAPPABLE FAN ARRAY MODULE DESIGN

CROSS REFERENCE TO RELATED APPLICATIONS

This application claims priority under 35 U.S.C. § 119 to U.S. Provisional Application No. 62/613,869, entitled "REAR SIDE SWAPPABLE FAN ARRAY MODULE DESIGN", and filed on Jan. 5, 2018. The contents of that application are hereby incorporated by reference in their entirety.

FIELD OF THE INVENTION

This application generally relates to a fan system management, and more specifically to the maintenance and replacement of a fan unit, that can be configured based on system requirements.

BACKGROUND

In a conventional rack system, one or more servers are often mounted with a fan system. Such a fan system typically includes a frame, with a fixed partition, to house individual fan units. However, traditional fan units can range in size. For example, in some conventional designs, eight 80 mm fan units can be housed in a fan system. In other conventional designs, up to three 140 mm fan units can be housed in a fan system. Consequently, conventional fan systems in rack systems typically have a fixed frame built-in to accommodate a fixed number of fan units of a particular size. This also results in a maximum cooling capacity for the fan system. Thus, to repair such a fan system, the entire frame and fixed partition must typically be removed, thereby increasing costs and difficulty for maintaining the rack system. Further, if the servers in the rack system are changed or modified such that the current fan system performance is not adequate to provide proper cooling, then the entire fan system would need to be replaced with a different fan configuration capable of cooling the new or modified server configuration.

SUMMARY

The following presents a simplified summary of one or more embodiments in order to provide a basic understanding of present technology. This summary is not an extensive overview of all contemplated embodiments of the present technology, and is intended to neither identify key or critical elements of all examples, nor delineate the scope of any or all aspects of the present technology. Its sole purpose is to present some concepts of one or more examples in a simplified form as a prelude to the more detailed description that is presented later.

The present disclosure provides for a server device with a fan module that includes a removable or reconfigurable partition for different size fan units based on system requirements. The chassis can include a plurality of sleds and a fan module. The fan module includes a removable partition. The removable partition is configured to house a plurality of fan units.

In some embodiments of the disclosure, the plurality of fan units comprises fan units of a first size. In alternative embodiments of the disclosure, the plurality of fan units comprises fan units of a second size. In some embodiments of the disclosure, the removable partition is configured to house a plurality of first fan units and a plurality of second fan units, where the plurality of first fan units comprises a first size; and the plurality of second fan units comprises a second size. For example, the removable partition comprises components that are interchangeable to accommodate the plurality of first fan units and the plurality of second fan units. The chassis of the fan unit can also include a power distribution board (PDB) configured to connect to the fan module via a fan board located on the fan module. In some embodiments of the disclosure, the fan module can be made up of sheet metal.

The present disclosure also provides a fan module configured with the flexibility to include different size fan units based on system requirements. In some embodiments of the disclosure, the plurality of fan units comprises fan units of a first size. In alternative embodiments of the disclosure, the plurality of fan units comprises fan units of a second size. In some embodiments of the disclosure, the removable partition is configured to house a plurality of first fan units and a plurality of second fan units, where the plurality of first fan units comprises a first size, and the plurality of second fan units comprises a second size. For example, the removable partition comprises components that are interchangeable to accommodate the plurality of first fan units and the plurality of second fan units.

BRIEF DESCRIPTION OF THE DRAWINGS

In order to describe the manner in which the above-recited and other advantages and features of the disclosure can be obtained, a more particular description of the principles described above will be rendered by reference to specific examples illustrated in the appended drawings. These drawings depict only example aspects of the disclosure, and are therefore not to be considered as limiting of its scope The principles are described and explained with additional specificity and detail through the use of the following drawings. The disclosure, and its advantages and drawings, will be better understood from the following description of exemplary embodiments together with reference to the accompanying drawings. These drawings depict only exemplary embodiments, and are therefore not to be considered as limitations on the scope of the various embodiments or claims.

DETAILED DESCRIPTION

Figure 1:
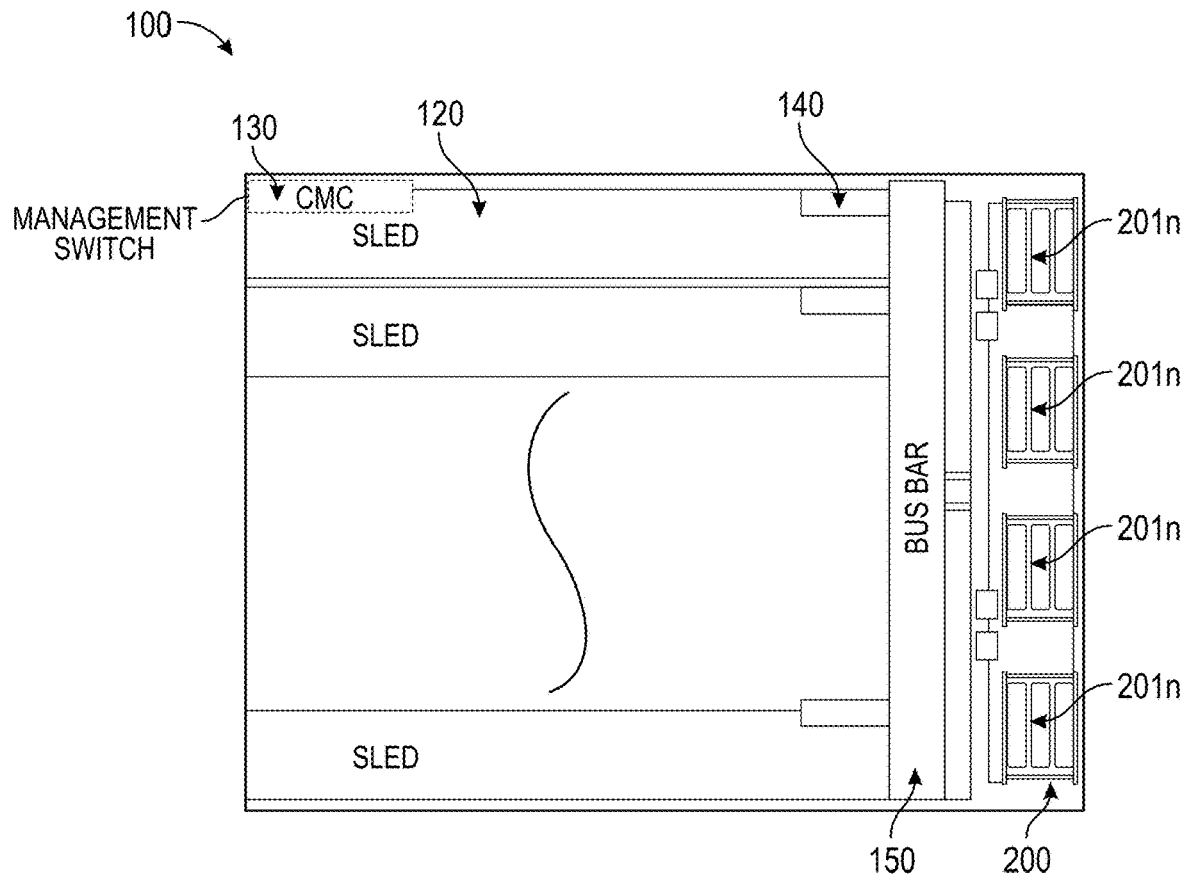
FIG. 1 illustrates a top view of an exemplary chassis apparatus as known in the prior art.

The present invention is described with reference to the attached figures, where like reference numerals are used throughout the figures to designate similar or equivalent elements. The figures are not drawn to scale, and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details, or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The present disclosure provides for a (or describes a) chassis that enables a fan module to have the flexibility to include different size fan units based on system requirements. The chassis can include a plurality of sleds and a fan module. The fan module includes a removable partition. The removable partition is configured to house a plurality of fan units.

Figure 2:
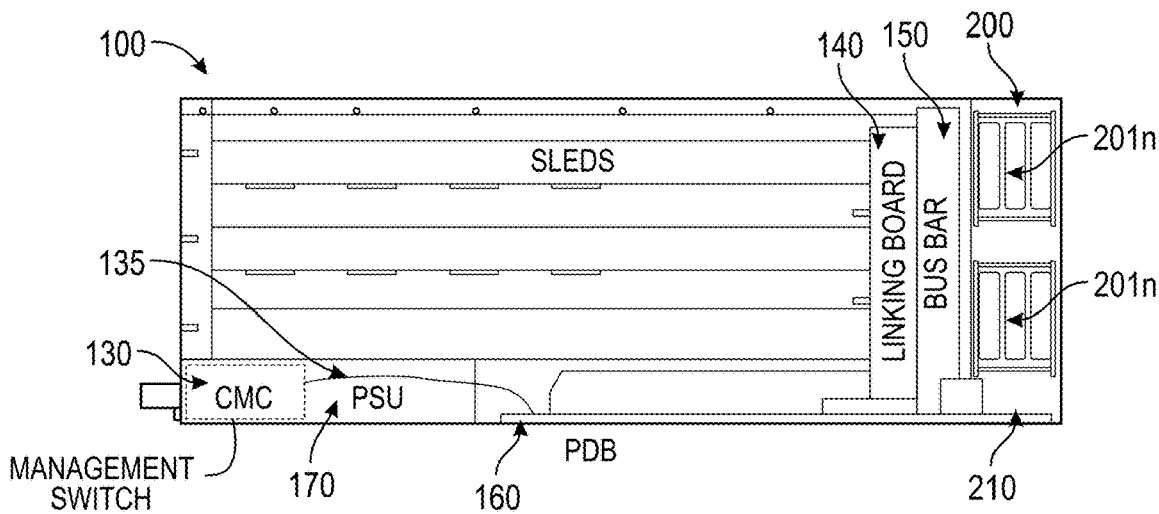
FIG. 2 illustrates a side view of the exemplary chassis apparatus of FIG. 1 as known in the art.

FIG. 1 illustrates a top view of an exemplary chassis apparatus 100 as known in the prior art. FIG. 2 illustrates a side view of the exemplary chassis apparatus of FIG. 1. The chassis 100 can be inserted into a rack system (not shown herein), and configured to house a plurality of chasses such as chassis 100. The chassis 100 can include at least one sled 120. FIG. 1 provides a chassis 100 with a plurality of sleds 120. The sled can be configured to house a server or node (not shown), which is made up of multiple electronic components. The chassis 100 can also include a chassis management controller (CMC) 130. The CMC 130 is configured to manage the chassis 100. Specifically, the CMC 130 is configured to manage data transmission within the chassis 100 and manage all nodes within the chassis. The chassis 100 can include a linking board 140 for each sled 120.

The chassis 100 can also include a bus bar 150, which is configured to provide electrical power to each of the sleds 120. The chassis 100 can also include a power distribution board (PDB) 160 configured to connect all components within the chassis 100 to the bus bar 150. For example, the linking board 140 of the sled 120 can be connected to the bus bar 150 via the PDB 160. The sled 120 can include a power supply unit 170 configured to power all of the components installed therein. The linking board 140 is fixed on the chassis 100 and connected to the PDB 160. In alternative conventional designs, cables can be implemented in lieu of the linking board 140. The CMC 130 is installed within the chassis 100 and connected to the PDB 150 by cable 135.

The chassis 100 can also include a fan module 200. The fan module 200 includes a plurality of fan units 201n and a fan board 210. Each of the fan units 201n can be connected to the fan board 210 by cables (not shown). The fan board 210 is configured to connect to the bus bar 150 via the PDB 160 to power the fan module 200. FIGS. 1 and 2 illustrate the fan module 200, which includes eight total fan units 201n (four columns of units shown in FIG. 1 and two rows of units shown in FIG. 2) fixed within the fan module.

Figure 3:
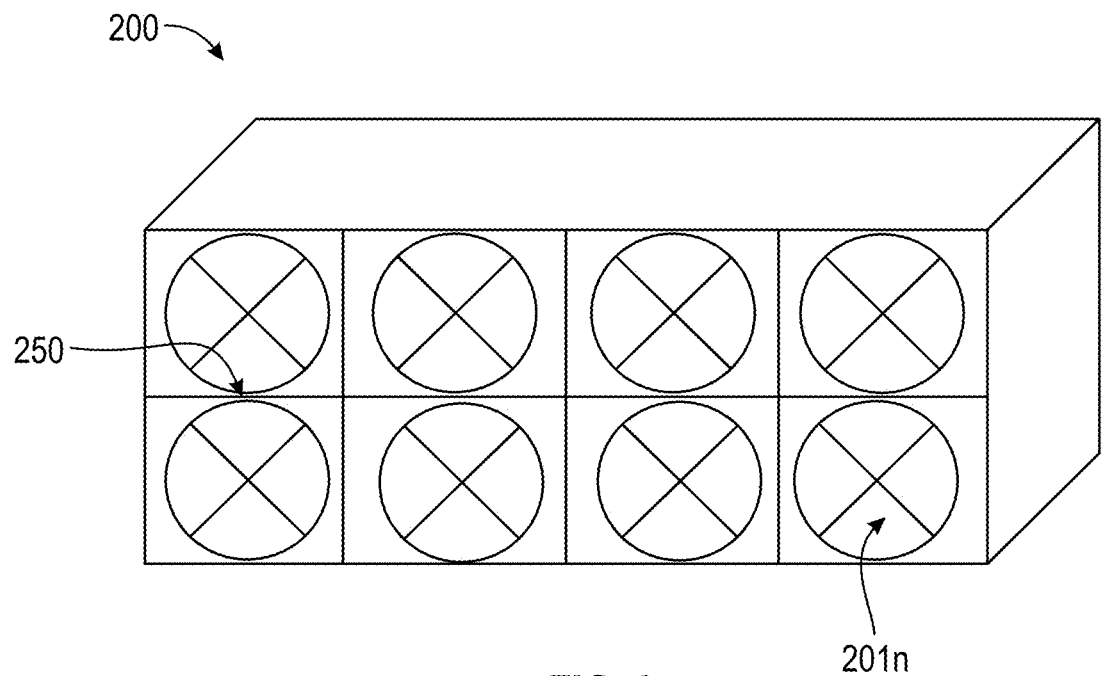
FIG. 3 illustrates an isometric view of a conventional fan module including a fixed partition.

FIG. 3 illustrates an isometric view of the fan module 200 including a fixed partition 250. The fan module 200 has a fixed partition 250 built-in to accommodate the fan units 201n based on size. Specifically, FIG. 3 illustrates the fan module 200 for fan units 201n of a first size. For example, fan units can have a dimension of 80 millimeters. The partition 250 is fixed within the fan module 200. As such, repairing the fan module 200 requires removing the entire fan module 200 and fixed partition 250. Further, if the current fan module's cooling performance is not adequate to optimize performance of the electronic components (not shown) within the chassis 100, the entire fan module 200 needs to be replaced with one that provides higher cooling performance.

To avoid the limitations of conventional fan modules, the present disclosure contemplates providing a fan module with a removable or reconfigurable partition. Thus, by removing or reconfiguring the partition, the fan module can be used with a variety of fan sizes in a variety of configurations. This is described in further detail below.

Figure 4A:
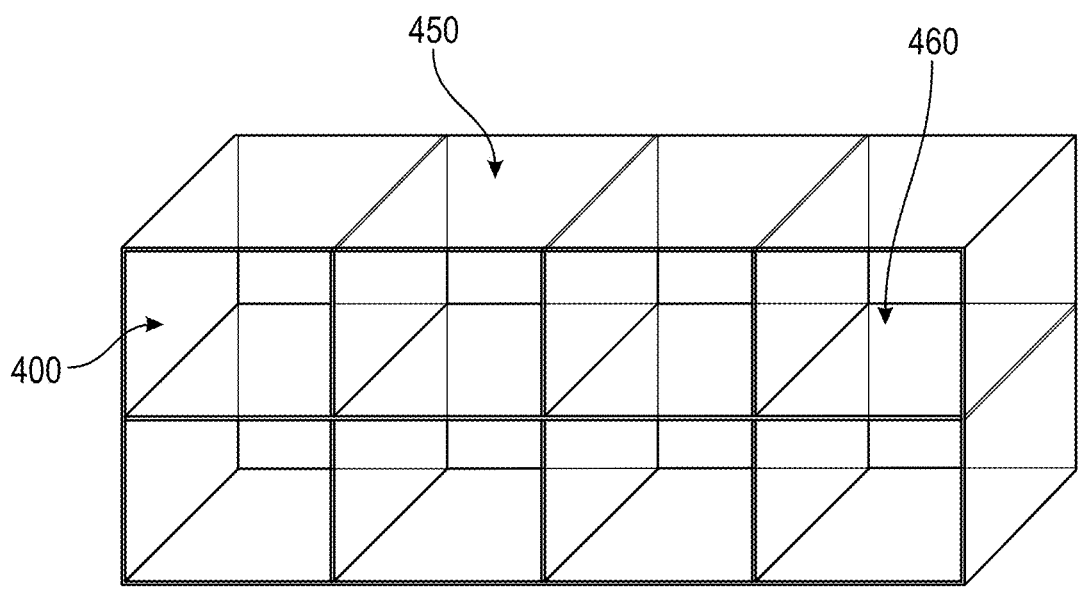
FIG. 4A illustrates an isometric assembled view of a fan module, including a removable partition in accordance with an embodiment in the present disclosure.
Figure 4B:
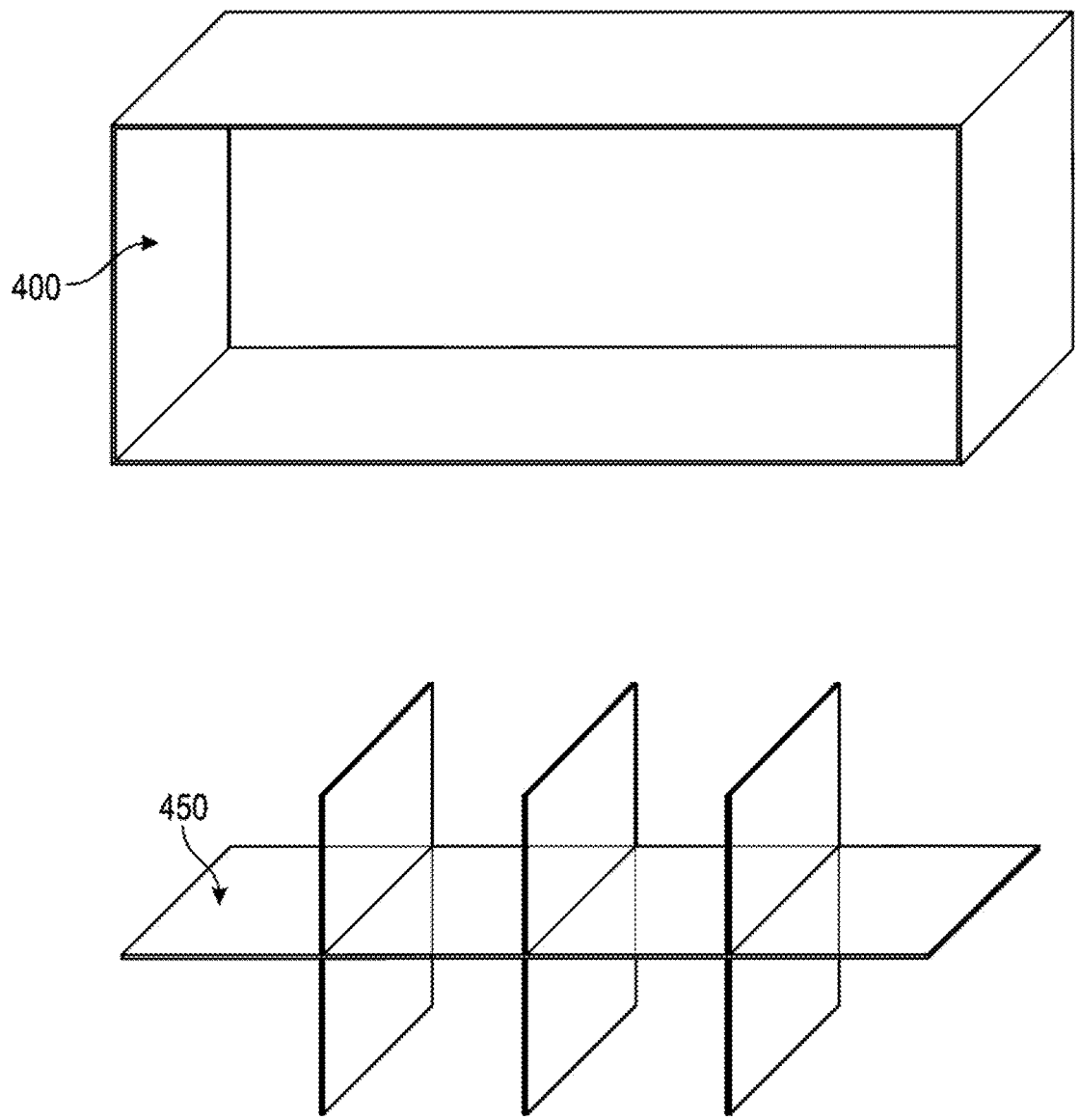
FIG. 4B illustrates an isometric exploded view of the fan module of FIG. 4A, including the removable partition in accordance with an embodiment in the present disclosure.

FIGS. 4A and 4B schematically illustrates an isometric view of a fan module 400, including a removable partition 450 in accordance with an embodiment in the present disclosure. FIG. 4A is an assembled view and FIG. 4B is an exploded view. As shown in FIGS. 4A and 4B, the fan module 400 can be configured to support a removable partition 450. Thus, when the partition 450 is inserted into the fan module 400, spaces 460 for fans (not show) are provided. When the partition 450 is removed, the fan module 400 then has space for larger fans. Alternatively, a different partition could also be inserted to support other sizes of fans. Additionally, the partition 450 can also be configured so that different portions of the partition 450 can be selectively removed. Thus, the partition 450 could support a variety of fan sizes in a variety of configurations.

The present disclosure contemplates that the fan module 400 and its components can be made of sheet metal using conventional metal fabrication techniques such as bending, forming, and stamping. As a result, the fan module 400 can be made very inexpensively. Alternatively, the fan module 400 and its components can be made of aluminum alloy, steel alloy, or any combination thereof. It should be realized that the fan module 400 and its components can be made of any material constructed to withstand varying temperatures and air flow of high velocity (from a plurality of fan modules not shown). The materials mentioned above are only for example, and not to limit this disclosure. A person having ordinary knowledge in the art may flexibly select any material in accordance with the disclosure.

Figure 5:
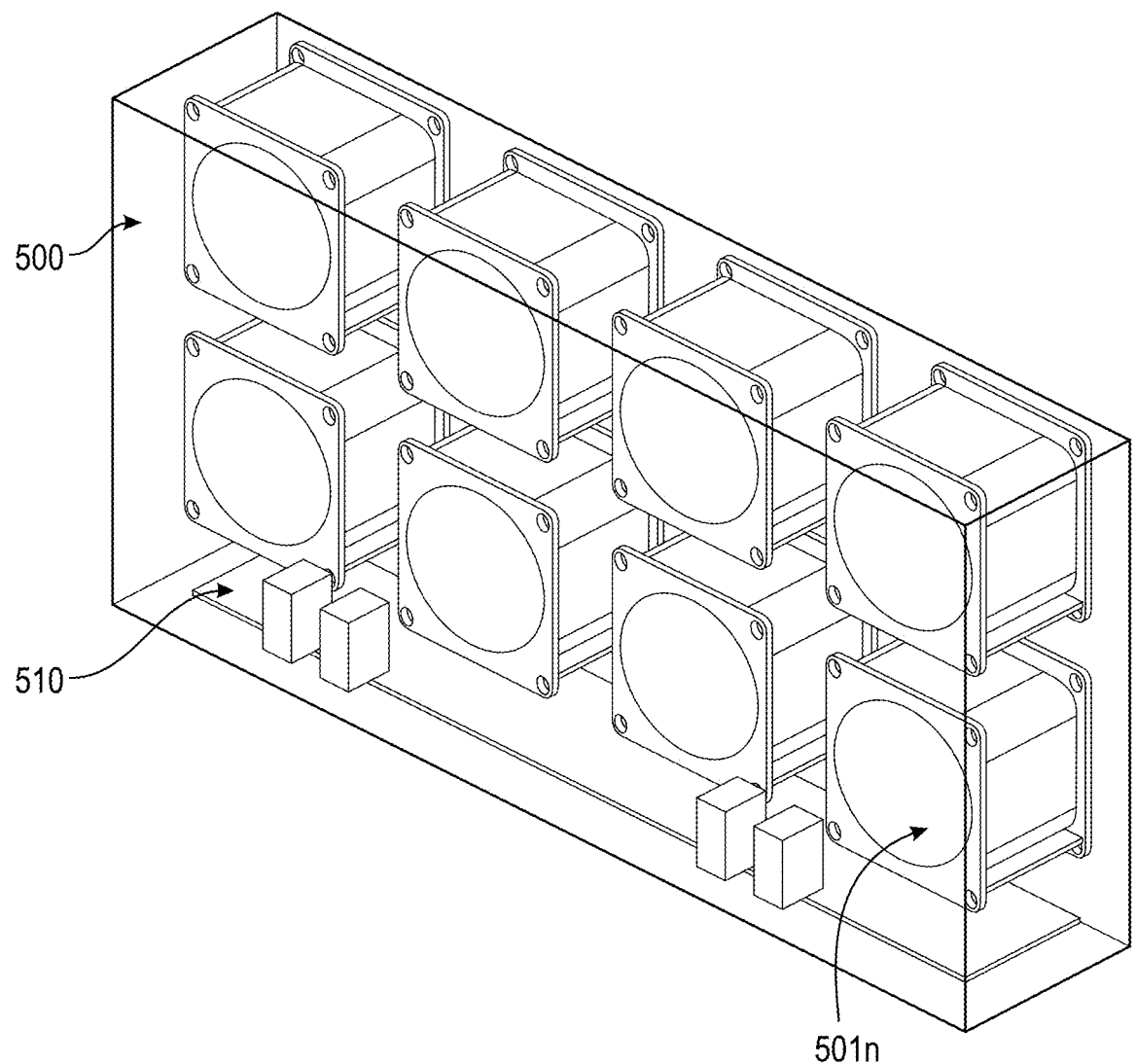
FIG. 5 illustrates a top isometric view of an exemplary fan module 500 configured according to the configuration illustrated in FIGS. 4A and 4B, in accordance with an embodiment in the present disclosure.

FIG. 5 illustrates a top isometric view of an exemplary fan module 500 configured according to the configuration shown in FIGS. 4A and 4B. As shown in FIG. 5, the fan module 500 is configured to house eight fan units 501n, in accordance with an embodiment in the present disclosure (for example, an eight 80 mm fan unit). As also shown in FIG. 5, the fan module 500 includes a fan board 510. Each of the fan units 501n can be connected to the fan board 510 by cables (not shown). The fan board 510 can be configured to connect to a bus bar (not shown) via a PDB (not shown) to power the fan module 500.

Figure 6A:
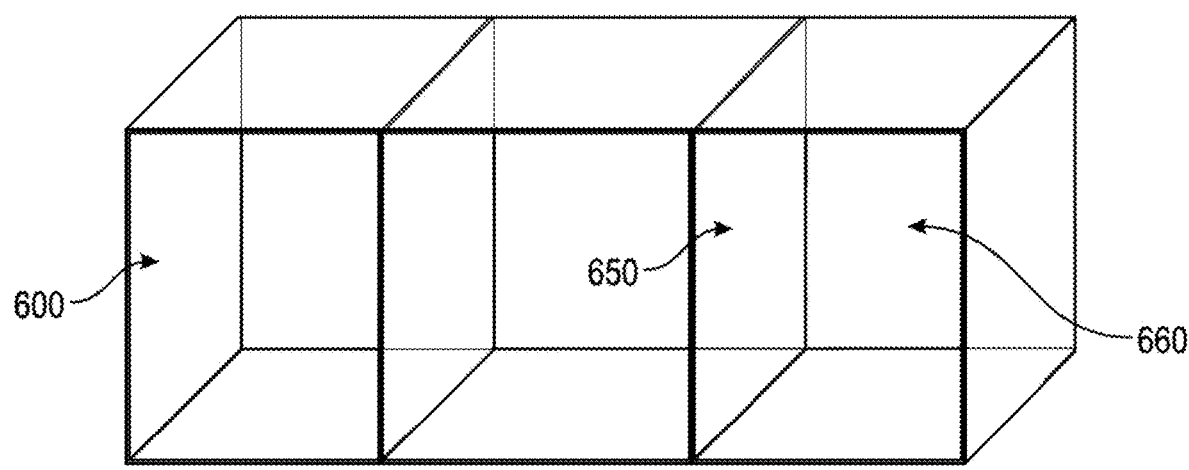
FIG. 6A illustrates an isometric assembled view of a fan module, including a removable partition in accordance with an embodiment in the present disclosure.
Figure 6B:
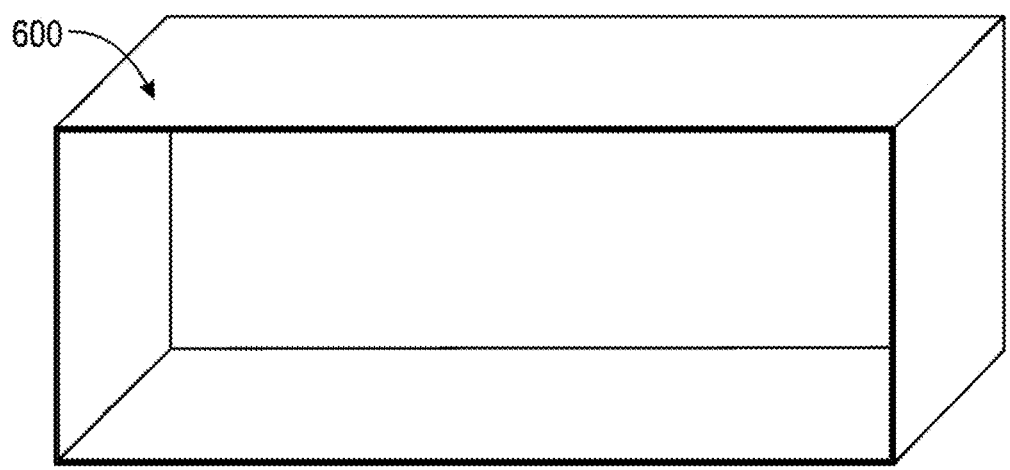
FIG. 6B illustrates an isometric exploded view of the fan module of FIG. 6A, including the removable partition in accordance with an embodiment in the present disclosure.
Figure 6B:
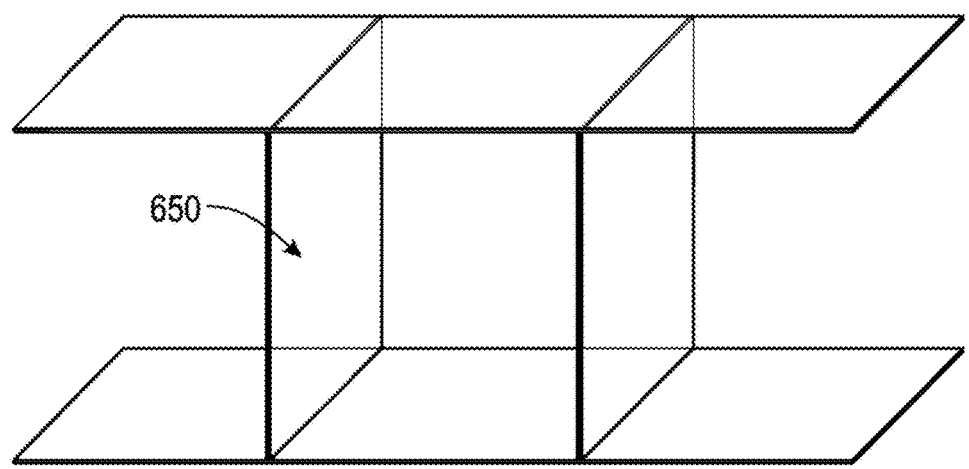

As noted above, a partition for a fan module can be configured in a variety of ways to support different fan sizes and arrangements. For example, FIGS. 6A and 6B illustrate an isometric view of a fan module 600, including a removable partition 650 in accordance with an embodiment in the present disclosure. FIG. 6A is an assembled view, and FIG. 6B is an exploded view. As shown in FIGS. 6A and 6B, the fan module 600 can be configured to support a removable partition 650. Thus, when the partition 650 is inserted into the module, spaces 660 for fans (not show) are provided. When the partition 650 is removed, the fan module 600 then has space for larger fans. Alternatively, partition 650 can also be replaced to support various size fans. For example, partition 650 could be replaced with partition 450 of FIG. 4 to support a different arrangement of fans (not shown).

The fan module 600 and its components can be made of sheet metal using conventional metal fabrication techniques such as bending, forming, and stamping. As a result, the fan module 600 can be made very inexpensively. Alternatively, the fan module 600 and its components can be made of aluminum alloy, steel alloy, or any combination thereof. It should be realized that the fan module 600 and its components can be made of any material constructed to withstand varying temperatures and air flow of high velocity (from a plurality of fan modules not shown). The materials mentioned above are only for example, and not to limit this disclosure. A person having ordinary knowledge in the art may flexibly select any material in accordance with the disclosure.

Figure 7:
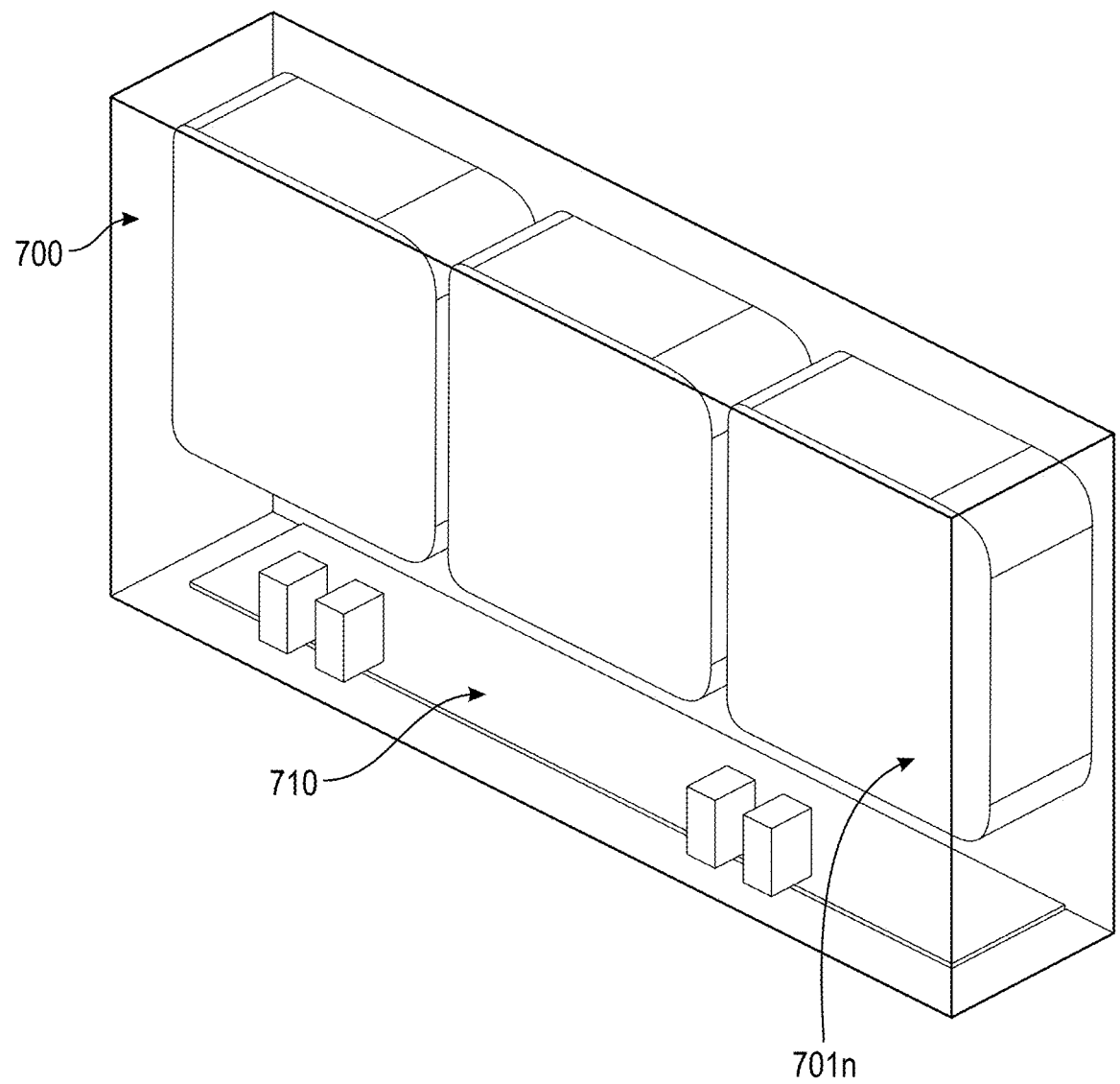
FIG. 7 illustrates a top isometric view of an exemplary fan module configured according to the configuration in FIGS. 6A and 6B, in accordance with an embodiment in the present disclosure.

FIG. 7 illustrates a top isometric view of an exemplary fan module 700 configured according to the configuration in FIGS. 6A and 6B. As shown in FIG. 7, The fan module 700 is configured to house three fan units 701n, in accordance with an embodiment in the present disclosure (for example, three 140 mm fan units). The fan module 700 also includes a fan board 710. Each of the fan units 701n can be connected to the fan board 710 by cables (not shown). The fan board 710 is configured to connect to a bus bar (not shown) via a PDB (not shown) to power the fan module 700.

Figure 8A:
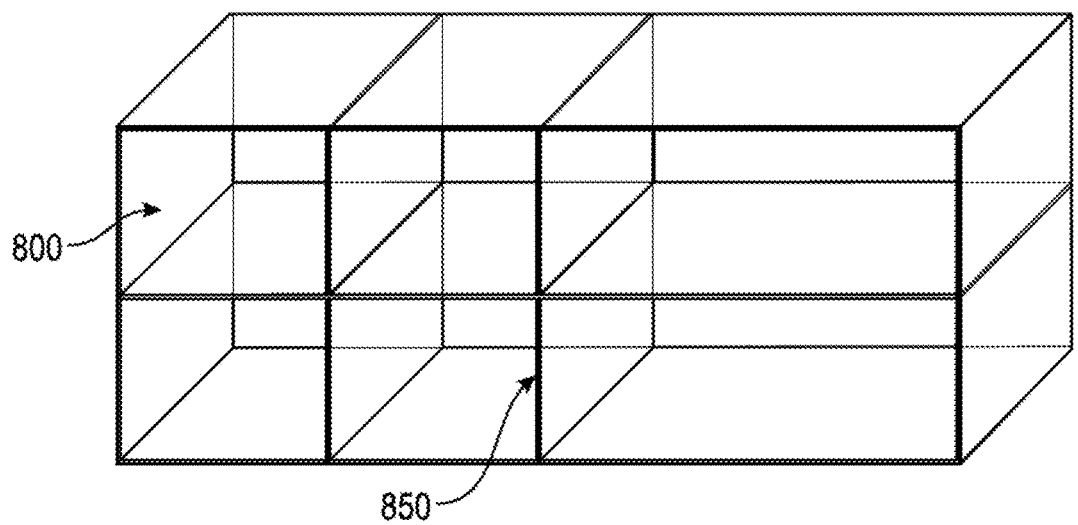
FIG. 8A illustrates a top isometric assembled view of a fan module configured to house a combination of fan units of a first size and fan units of a second size, in accordance with an embodiment in the present disclosure.
Figure 8B:
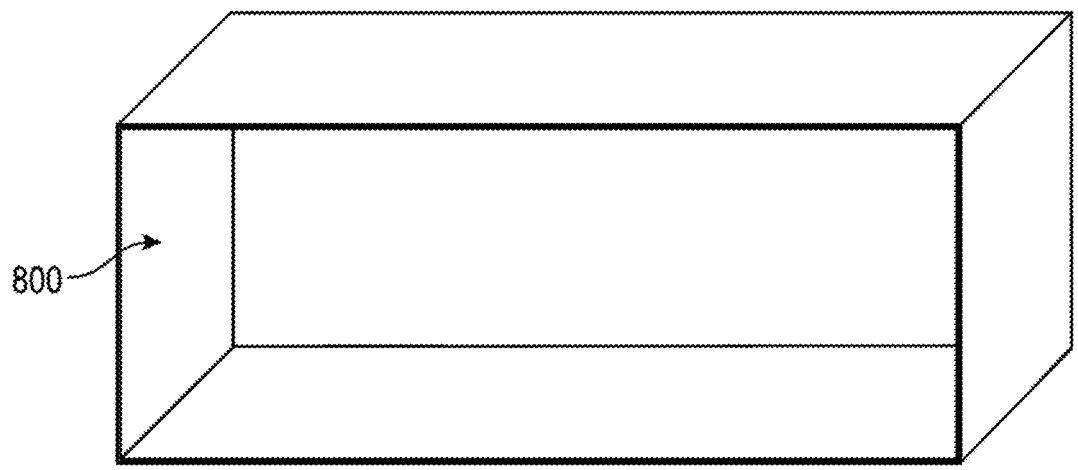
FIG. 8B illustrates a top isometric assembled view of a fan module configured to house a combination of fan units of a first size and fan units of a second size, in accordance with an embodiment in the present disclosure.
Figure 8B:
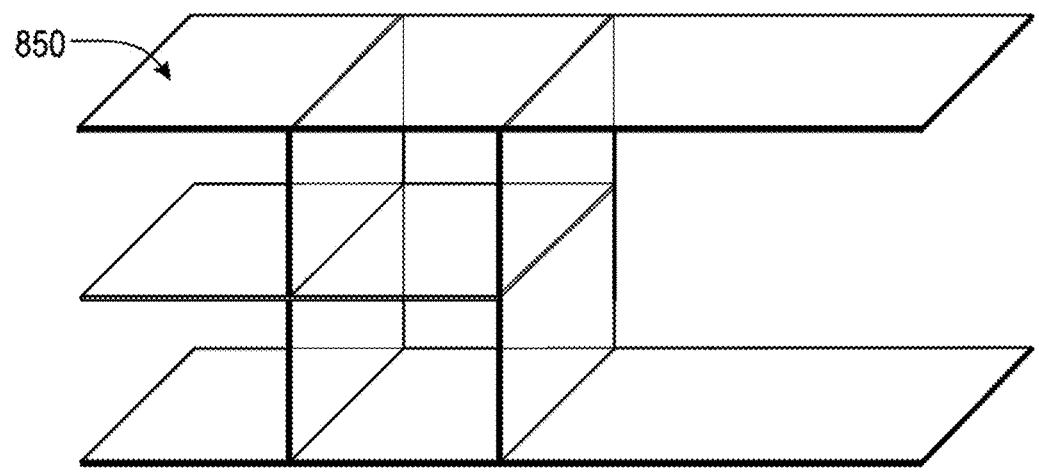

As noted above, a partition for a fan module in accordance with the present disclosure can be configured to support a variety of fan sizes and arrangement thereof. For example, FIGS. 8A and 8B illustrate a top isometric view of a fan module 800 configured to house a combination of fan units of a first size and fan units of a second size, in accordance with an embodiment in the present disclosure (for example, a combination of 80 mm and 140 mm fan units). FIG. 8A is an assembled view, and FIG. 8B is an exploded view. The fan module 800 includes a removable partition 850. In some embodiments, the fan module 800 can include a combination of fan units, such as fan units 501n (from FIG. 5) and 701n (from FIG. 7). The removable partition 850 can be customizable to accommodate system needs. For example, electronic components can be positioned in different positions within a chassis, where one side can include fan units 501n (e.g., 80 mm fan units) and the opposing side can include a single fan unit 701n (e.g., a 140 mm fan unit) to optimize performance of the fan module 800.

The partitions of FIGS. 4B and 6B can be reconfigurable based on technician preference. A partition can be implemented that includes the vertical and horizontal components in a variety of ways. For example, the vertical and horizontal components can be arranged in any way that maximizes the number of fan units within the fan module. In some embodiments, the partition components can include slits that allow for a tool-less interlocking. For example, the vertical and horizontal components can be connected to each other vertically, horizontally, or even diagonally through side slits without screws or fixes. Furthermore, the partition components can include guide holes configured to receive fasteners to secure the partition components together. The fasteners can include, for example, screw/tapped screw hole or nut/bolt combinations. Other connections such as snap or press fits or rivets can also be used implemented. The partition is configured to be assembled without tools to achieve a sturdy structure of varying orientations.

The previous description of the disclosure is provided to enable any person skilled in the art to make or use the disclosure. Various modifications to the disclosure will be readily apparent to those skilled in the art, and the generic principles defined herein can be applied to other variations without departing from the scope of the disclosure. Thus, the disclosure is not intended to be limited to the examples and designs described herein, but is to be accorded the widest scope consistent with the principles and novel features disclosed herein.

What is claimed is:

1. A server device comprising:
a plurality of sleds; and
a fan module comprising a removable partition,
wherein spaces defined by the removable partition are configured to house a plurality of fan units,
wherein, when the removable partition is installed on the fan module, the fan module is configured to support a fan unit having a first size,
wherein, when the removable partition is reconfigured, the fan module is configured to support at least one fan unit having a second size,
wherein the second size is larger than the first size, and
wherein the spaces defined by the removable partition house a plurality of first fan units and a plurality of second fan units, wherein the plurality of first fan units comprises the first size, and the plurality of second fan units comprises the second size.

2. The chassis of claim 1, further comprising a power distribution board (PDB) configured to connect to the fan module via a fan board located on the fan module.

3. The chassis of claim 1, wherein the fan module comprises sheet metal.

4. The chassis of claim 1, wherein the removable partition comprises components that are interchangeable to accommodate the plurality of first fan units and the plurality of second fan units.

5. A fan module comprising:
a removable partition; and
a plurality of fan units each housed within separate spaces defined by the removable partition,
wherein, when the removable partition is installed on the fan module, the fan module is configured to support a fan unit having a first size,
wherein, when the removable partition is reconfigured, the fan module is configured to support at least one fan unit having a second size,
wherein the second size is larger than the first size, and
wherein the spaces defined by the removable partition house a plurality of first fan units and a plurality of second fan units, wherein the plurality of first fan units comprises the first size and the plurality of second fan units comprises the second size.

6. The fan module of claim 5, further comprising a fan board configured to connect to a power distribution board (PDB).

7. The fan module of claim 5, wherein the fan module comprises sheet metal.

8. The fan module of claim 5, wherein the removable partition comprises components that are interchangeable to accommodate the plurality of first fan units and the plurality of second fan units.

* * * * *